US012633892B2

(12) United States Patent

Lee et al.

(10) Patent No.: US 12,633,892 B2

(45) Date of Patent: May 19, 2026

(54) ACOUSTIC WAVE PROPAGATION DEVICE HAVING MEDIUM FOR ACOUSTIC WAVE PROPAGATION AND THE MAKING METHOD OF THE MEDIUM FOR ACOUSTIC WAVE PROPAGATION

(71) Applicant: Industry-Academic Cooperation Foundation, Yonsei University, Seoul (KR)

(72) Inventors: Hyung Suk Lee, Seoul (KR); Jun Ki Baek, Seoul (KR); Chan Ryeol Rhyou, Seoul (KR); Byung Jun Kang, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 653 days.

(21) Appl. No.: 17/450,798

(22) Filed: Oct. 13, 2021

(65) Prior Publication Data

US 2022/0116011 A1 Apr. 14, 2022

(30) Foreign Application Priority Data

Oct. 13, 2020 (KR) ........................ 10-2020-0131800

(51) Int. Cl.
*H03H 9/02* (2006.01)
*B01L 3/00* (2006.01)
(Continued)

(52) U.S. Cl.
CPC .................... *H03H 9/02535* (2013.01); *B01L 3/502761* (2013.01); *H03H 9/15* (2013.01); *H10N 30/01* (2023.02); *B01L 2400/0436* (2013.01)

(58) Field of Classification Search
CPC .... H03H 9/02; H03H 9/15; B01L 3/50; B01L 24/04; A61B 8/08; A61B 8/00
See application file for complete search history.

(56) References Cited

U.S. PATENT DOCUMENTS

2016/0030660 A1* 2/2016 Sun ...................... A61M 1/3687
                                        210/748.05
2016/0242736 A1* 8/2016 Freiburg .................. A61B 8/14
                        (Continued)

FOREIGN PATENT DOCUMENTS

JP          6758779 B2     9/2020
KR      20180036960 A     4/2018
                (Continued)

OTHER PUBLICATIONS

Office Action dated Oct. 18, 2021 in Korean Application No. 10-2020-0131800.

*Primary Examiner* — Patrick Orme

(74) *Attorney, Agent, or Firm* — Knobbe, Martens, Olson & Bear, LLP

(57) ABSTRACT

The present invention relates to an acoustic wave transmission device for moving a fluid or fine particles inside the fluid to a desired position using acoustic waves, and more particularly, to an acoustic wave transmission device including an acoustic wave transmission medium that minimizes acoustic wave interference due to the acoustic wave transmission medium by reducing reflection and refraction that may be generated when acoustic waves pass through the acoustic wave transmission medium in which a fluid is accommodated, and a manufacturing method of the acoustic wave transmission medium.

7 Claims, 11 Drawing Sheets

(51) Int. Cl.
H03H 9/15 (2006.01)
H10N 30/01 (2023.01)

(56) References Cited

U.S. PATENT DOCUMENTS

2017/0298316 A1 * 10/2017 Kennedy, III ......... C12M 23/14
2019/0126276 A1 * 5/2019 Ward ................. G01N 15/1404

FOREIGN PATENT DOCUMENTS

WO    WO-2016161082 A1 * 10/2016 ............. G01N 21/05
WO    WO-2017176211 A1 * 10/2017 ................ B01L 3/00

* cited by examiner

Cutting

A721

A630

300a          300b 200a          200b

ACOUSTIC WAVE PROPAGATION DEVICE HAVING MEDIUM FOR ACOUSTIC WAVE PROPAGATION AND THE MAKING METHOD OF THE MEDIUM FOR ACOUSTIC WAVE PROPAGATION

TECHNICAL FIELD

The following disclosure relates to an acoustic wave transmission device for moving a fluid or fine particles inside the fluid to a desired position using acoustic waves, and more particularly, to an acoustic wave transmission device including an acoustic wave transmission medium that minimizes acoustic wave interference due to the acoustic wave transmission medium by reducing reflection and refraction that may be generated when acoustic waves pass through the acoustic wave transmission medium in which a fluid is accommodated, and a manufacturing method of the acoustic wave transmission medium.

BACKGROUND

The technology of moving a fluid and fine particles in the fluid to a desired position using acoustic waves is non-invasive, has high cost-efficiency and biocompatibility, and is capable of performing label-free manipulation, and thus is being used in various fields requiring manipulation of the fine particles such as biomedical, tissue engineering, diagnostic medical, and pharmaceuticals through separation, alignment, concentration, purification, and mixing of substances.

In order to implement such a technology, a working space such as a chamber or channel for confining or allowing a fluid or a mixed solution of fine particles to flow is required.

FIG. 1 illustrates a plan view of a conventional acoustic wave transmission device, FIG. 2 illustrates a conceptual diagram illustrating a principle of manipulation of fine particles in a fluid using the conventional acoustic wave transmission device, and FIG. 3 illustrates a cross-sectional view illustrating total reflection of acoustic waves of the conventional acoustic wave transmission device.

As illustrated, in order to transfer a fine particle B in a fluid L flowing inside a channel 20, which is an acoustic wave transmission medium, the fine particle B may be transferred to a desired position by placing acoustic wave generators 10 and 10a on one side or the other side, or both sides of the channel 20, generating an acoustic wave W through the acoustic wave generators 10 and 10a and fixing (collecting) the fine particle B at the desired position on the fluid L, and then controlling a phase of the acoustic wave W.

In this case, as a composition of the channel 20 used for the manipulation of the fluid and the fine particles in the fluid based on the acoustic wave, polydimethylsiloxane (PDMS), glass, or silicon has been mainly used for easy fabrication and easy internal observation. However, since the above-mentioned materials are made of a material having a property different from that of the fluid L inside the channel 20, unnecessary wave interference phenomena such as reflection and refraction occur at an interface between the channel 20 and the fluid L when the acoustic wave is transmitted into the channel 20, which may result in causing error in the manipulation of the fluid L in the channel 20 and the fine particle B in the fluid.

More specifically, as illustrated in FIG. 3, since the acoustic wave passing through the channel 20 generates total reflection at the interface between the channel 20 and the fluid L when the acoustic wave is transmitted into the channel 20 by using the acoustic wave generator 10, an anechoic region is formed in a fluid space inside the channel 20 as illustrated by a black block in the drawing, and the fine particles B located in the above-mentioned space may not be manipulated.

RELATED ART DOCUMENT

Patent Document

Korean Patent Laid-Open Publication No. 10-2018-0036960 (2018 Apr. 10.)

SUMMARY

Technical Tasks

An embodiment of the present invention is to provide an acoustic wave transmission device capable of minimizing reflection and refraction that may occur at an interface between an acoustic wave transmission medium and a fluid at the time of transmitting an acoustic wave by composing the acoustic wave transmission medium with a material having a property similar to that of the fluid accommodated therein, in particular, a material having a speed of sound and acoustic impedance similar to those of the fluid.

Further, an embodiment of the present invention is to provide a manufacturing method of an acoustic wave transmission medium capable of manufacturing an acoustic wave transmission medium including a channel or chamber of a micro unit or less.

Technical Solution

In one general aspect, an acoustic wave transmission device includes an acoustic wave transmission medium in which a fluid is accommodated; and an acoustic wave generator disposed adjacent to the medium to transmit an acoustic wave to the acoustic wave transmission medium to transport the fluid or fine particles in the fluid to a desired position, wherein the acoustic wave transmission medium is made of a material having a speed of sound, acoustic impedance, or a speed of sound and acoustic impedance corresponding to that of the fluid.

The acoustic wave transmission medium may be made of polyurethane (PU) or hydrogel.

The fine particles may have a size of 1 nanometer or more and 100 micrometers or less.

The acoustic wave generator may include a substrate and a signal generator provided on the substrate to transmit surface acoustic waves to the acoustic wave transmission medium.

The substrate may be made of a piezoelectric element, and the acoustic wave transmission medium may be coupled to the piezoelectric element.

The substrate may be made in a form in which a piezoelectric element is coupled onto a flexible film, and the acoustic wave transmission medium may be coupled to the piezoelectric element.

The acoustic wave generator may include a silicon wafer to which the acoustic wave transmission medium is fixed, and may transmit bulk acoustic waves to the acoustic wave transmission medium through a resonance frequency of the silicon wafer.

The acoustic wave generator may include an acoustic transducer, and may contact the acoustic transducer with the acoustic wave transmission medium to transmit bulk acoustic waves to the acoustic wave transmission medium.

In another general aspect, a manufacturing method of an acoustic wave transmission medium includes disposing a first mold made of a metal material having a first pattern formed thereon in a chamber; filling the chamber in which the first mold is disposed with a liquid first resin; manufacturing a second mold made of a resin material having a first channel formed thereon by heating the first resin; repositioning the second mold in the chamber by separating the second mold; filling the chamber in which the second mold is repositioned with a liquid second resin; manufacturing a third mold made of a resin material having a second pattern formed thereon by heating the second resin; repositioning the third mold in the chamber by separating the third mold; filling the chamber in which the third mold is repositioned with a raw material for manufacturing the acoustic wave transmission medium; closely contacting the raw material to the third mold by pressing the raw material; and manufacturing an acoustic wave transmission medium having a channel or a chamber formed by solidifying the raw material in close contact with the third mold.

The raw material may include polyurethane (PU).

The channel or chamber may have a size in micrometer units.

The raw material may be made in the form of pellets, the closely contacting of the raw material to the third mold by pressing the raw material may include manufacturing a liquid raw material by pressing and heating the raw material toward the third mold, and the manufacturing of the acoustic wave transmission medium having the channel or the chamber formed by solidifying the raw material in close contact with the third mold may include manufacturing a medium resin by cooling the liquid raw material.

The medium resin may include a plurality of channels or chambers, and the acoustic wave transmission medium may be manufactured by cutting the resin so that the number of channels or chambers is singular or plural.

Advantageous Effects

According to the present invention, since the refraction or the reflection of the acoustic wave that may occur at the interface between the acoustic wave transmission medium and the fluid at the time of transmitting the acoustic wave may be minimized, it is possible to precisely manipulate the fluid and the fine particles in the fluid using the acoustic wave.

Further, in manufacturing an acoustic wave transmission medium with a material having a speed of sound and acoustic impedance similar to those of a fluid, it is possible to form a channel or chamber of a micro unit or less, thereby being applicable to acoustic wave transmission devices in more diverse fields.

DETAILED DESCRIPTION OF EMBODIMENTS

Hereinafter, the present invention will be described in detail with reference to the accompanying drawings.

An acoustic wave transmission device according to an embodiment of the present invention is configured to acoustically couple an acoustic wave generator to a tube through which a fluid is transferred and then apply acoustic waves to the fluid to move fine particles existing inside the fluid to a specific position.

In order to move the fine particles, bulk acoustic waves (BAW) or surface acoustic waves (SAW) may be used. In order to generate the acoustic waves as described above, a piezoelectric substrate, a signal generator, a resonance frequency of a silicon wafer, an acoustic transducer, and the like may be used.

Figure 4:
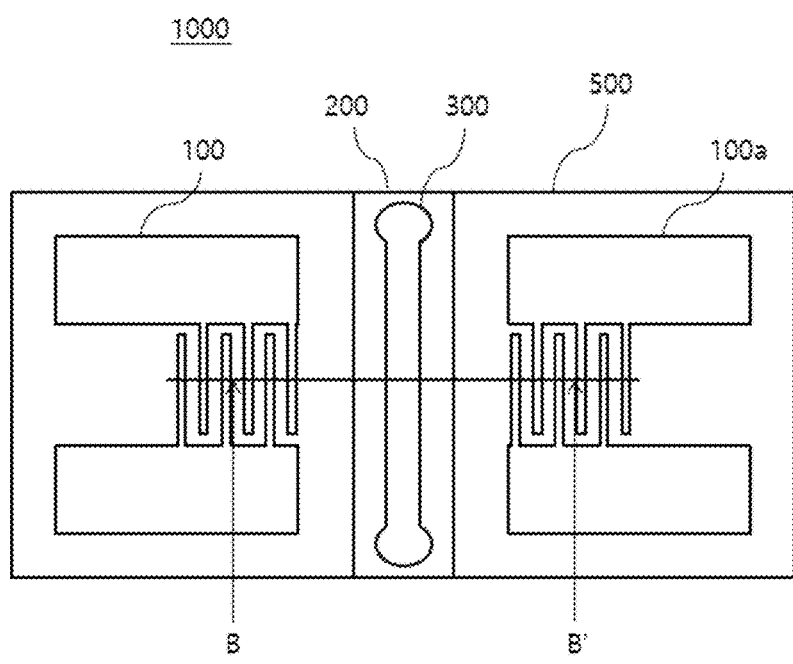
FIG. 4 is a schematic view illustrating an acoustic wave transmission device according to an embodiment of the present invention.
Figure 5:
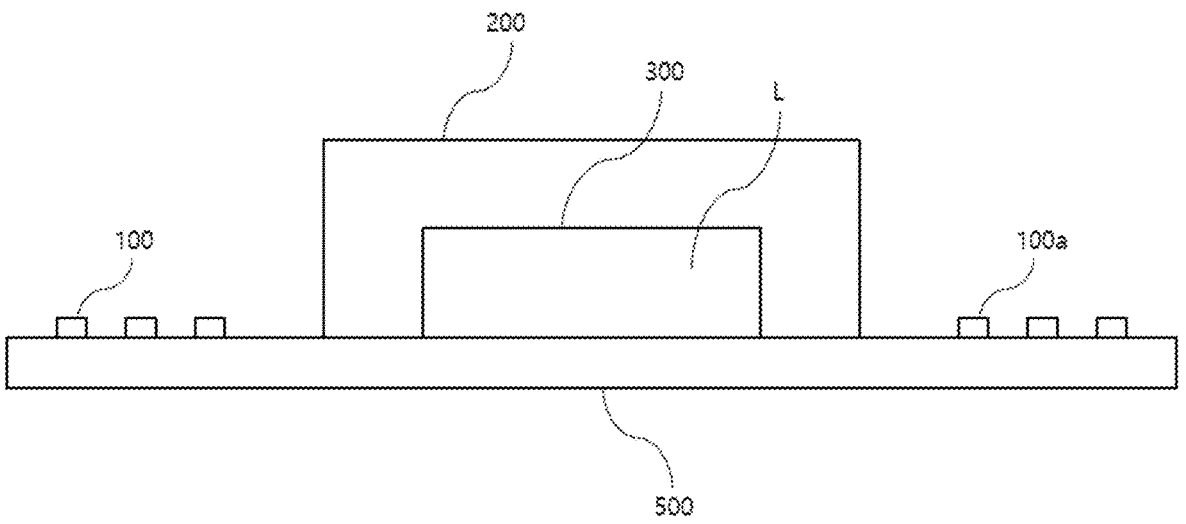
FIG. 5 is a cross-sectional view taken along line B-B' of FIG. 4.

FIG. 4 illustrates a schematic plan view of an acoustic wave transmission device 1000 including an acoustic wave transmission medium according to an embodiment of the present invention, and FIG. 5 illustrates a cross-sectional view taken along line B-B' of FIG. 4.

As illustrated, the acoustic wave transmission device 1000 may have an acoustic wave transmission medium 200 (hereinafter, "medium") disposed on one surface of a substrate 500. The medium 200 includes a chamber in which a fluid L is stored or a channel through which the fluid L is transported, and in the present embodiment, it is illustrated that a channel 300 through which the fluid L is transferred is formed in the medium 200. In addition, acoustic wave generators 100 and 100a may be disposed on one side and the other side of the medium 200, respectively, and may be configured to generate a standing acoustic wave to transfer the fine particles inside the fluid L to a specific position.

The acoustic wave generators 100 and 100a may include a signal generator provided on the substrate 500 to transmit surface acoustic waves to the acoustic wave transmission medium 200.

In this case, the substrate 500 is made of a piezoelectric substrate as an example, and the acoustic wave transmission medium 200 may be coupled to one surface thereof.

As another example, the substrate 500 may be configured to be coupled to the acoustic wave transmission medium 200 by attaching a piezoelectric element, for example, a piezoelectric material such as aluminum nitride (AlN) or zinc oxide ($ZnO_2$), to a flexible polyimide film, and then used by being attaching to a curved surface or the like.

Meanwhile, the acoustic wave generators 100 and 100a are exemplified as including interdigitated transducers (IDTs) in the form of interdigitated patterns at equal intervals, but are not limited thereto. That is, the intervals of the interdigitated patterns may be equally spaced, or may be all different intervals. In addition, the intervals of the interdigitated patterns may be provided not only in a straight shape but also in a curved shape.

As still another example, the acoustic wave generators 100 and 100a may be configured such that the substrate 500 is made of a silicon wafer and transmits bulk acoustic waves to the acoustic wave transmission medium 200 through a resonance frequency of the silicon wafer.

As still another example, the acoustic wave generators 100 and 100a may be configured to include an acoustic transducer, and contact the acoustic transducer with the acoustic wave transmission medium 200 to transmit the bulk acoustic waves to the acoustic wave transmission medium.

In this case, the medium 200 of the present invention may be made of a material having properties similar to that of the fluid L on the channel 300 to prevent total reflection and minimize refraction in transmitting the acoustic waves to the fluid, and more specifically, may be made of a material having the speed of sound and acoustic impedance similar to those of the fluid L.

Figure 3:
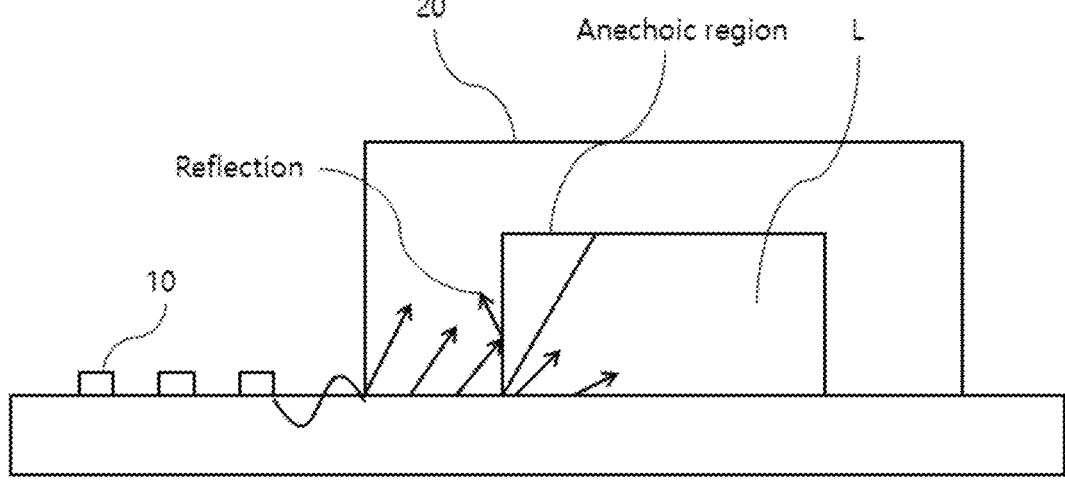
FIG. 3 is a cross-sectional view illustrating a total reflection of an acoustic wave of the conventional acoustic wave transmission device.

FIGS. 3 to 5 are diagrams illustrating propagation and total reflection of the surface acoustic waves when traveling surface acoustic waves are applied to a surface acoustic wave device. For example, referring to FIGS. 3 to 5, when the traveling surface acoustic wave propagates from the surface of the substrate 500 and meets another medium, the traveling surface acoustic wave propagates with a Rayleigh angle (8R) expressed as Equation 1 below. The Rayleigh angle refers to a refraction angle that occurs when the traveling surface acoustic wave propagates from the substrate to the medium. That is, the Rayleigh angle refers to an angle formed by a traveling direction of a wave indicated by a vertical line and an arrow on the substrate 500.

$$\theta_R = \arcsin\left(\frac{C_{wall}}{C_s}\right) \qquad \text{[Equation 1]}$$

In this case, $C_{wall}$ and $C_s$ refer to the speeds of sound of the medium 200 and the substrate 500 made of a material constituting the channel 300, respectively. When the wave propagates with the Rayleigh angle in the channel 300, total reflection may occur due to a ratio of the speeds of sound of the medium 200 forming a channel inner wall 310 of the channel 300 and the fluid. For reference, as a representative example used for the substrate 500, lithium niobate (LiNbO$_3$), which is one of the piezoelectric element materials, has a speed of sound of 3994 m/s, density of 4700 kg/m$^3$, and acoustic impedance of 18771 (kPa s/m) at room temperature (20±5° C.).

In this case, a critical angle $\theta_c$ at which the total reflection occurs is determined by Equation 2 below.

$$\theta_C = \arcsin\left(\frac{C_{wall}}{C_{fluid}}\right) \qquad \text{[Equation 2]}$$

$C_{fluid}$ refers to the speed of sound in the fluid. In order to remove the total reflection phenomenon at an interface between the medium 200 and the fluid, Equation 3 below needs to be satisfied. As a result, the critical angle means an angle between a line perpendicular to the interface between the medium 200 and the fluid and a traveling direction of the wave transmitted into the fluid.

$$\theta_C > \left(\frac{\pi}{2} - \theta_R\right) \qquad \text{[Equation 3]}$$

The fluid may be various fluids, such as blood or cell culture fluid, in addition to water, but the water is used for convenience here.

As a material having similar values of speed of sound and acoustic impedance, polyurethane (PU) or hydrogel, for example, agarose gel, polyacrylamide gel, or the like may be applied. Here, the speed of sound generally means the speed of sound at atmospheric pressure and room temperature, and the acoustic impedance Z means a density of the speed of sound.

In Table 1 below, the speed of sound and acoustic impedance of water, polyurethane (PU), and PDMS are compared.

TABLE 1

| Material | Speed of Sound (m/s) | Acoustic Impedance (kPa s/m) |
|---|---|---|
| Water | 1497 | 1494 |
| PU | 1538 | 1484 |
| PDMS (10:1) | 1041 | 1083 |

In the case in which the material of the medium 200 constituting the channel 300 is made of PDMS, $\theta_C$=46° and $\theta_R$=15.6° when calculated by substituting the values in Table 1, and as a result, since $(90°-\theta_R)>\theta_C$, the total reflection occurs. Accordingly, an anechoic region, which is a region in which waves do not easily propagate in the fluid inside the channel 300, is formed. Since the formation of the anechoic region means that an acoustic pressure field is not uniformly formed in the fluid inside the channel 300, it is difficult to manipulate the fine particles in the corresponding region.

As the difference in the speed of sound between the two media increases, a path of the wave is highly refracted at the interface between the media. As described in Table 1 above, in the case of PDMS, since the speed of sound is about 0.7 times smaller than that of water, which is a typical fluid, the wave is greatly refracted at the interface while propagating into the water, but since polyurethane (PU), which is a material of the medium 200 according to an embodiment of the present invention, has the speed of sound and acoustic impedance almost similar to those of water, it is possible to reduce a change in a path of a sound wave due to refraction or reflection at the interface.

Accordingly, when the acoustic wave is transmitted into the medium 200, the reflection of the acoustic wave is prevented and the effect of refraction is greatly reduced at the interface between the medium 200 and the fluid L, so that the anechoic region is not formed and the pressure field is one-dimensionally formed, and accordingly, since manipulation and position prediction of the particles on the fluid L are easy, the particles may be precisely moved to a desired position without additional channel or device design.

Specifically, when the acoustic wave is applied, a locally strong fluid flow occurs around the anechoic space in a conventional PDMS channel. The occurrence of such a local flow prevents uniform mixing of materials throughout the channel, thereby reducing the usability as a mixing device. On the other hand, in the case in which a channel made of a material having the speed of sound and acoustic impedance similar to those of water, such as polyurethane (PU), is used, since the total reflection does not occur at the interface between the channel wall and the fluid, a relatively uniform pressure field and flow field is formed in the fluid compared to the PDMS channel, which is advantageous for manipulation and mixing of the particles throughout the channel.

In the present invention, the meaning that the medium and the fluid have the speed of sound and acoustic impedance that are similar to or correspond to each other means that the speed of sound and acoustic impedance of the medium correspond to ±15% based on the speed of sound and acoustic impedance of the fluid, preferably, correspond to ±10%, and more preferably, correspond to ±5%. For example, in the case in which the fluid is water, since the speed of sound and acoustic impedance of water are 1497 and 1494, respectively, the speed of sound and acoustic impedance of the medium may be 1272 to 1722, and 1270 to 1718, which are ±15% based on the speed of sound and acoustic impedance of water, respectively, preferably, 1347 to 1646, and 1344 to 1643, which are ±10% based on the speed of sound and acoustic impedance of water, respectively, and more particularly, 1422 to 1571, and 1419 to 1568, which are ±5% based on the speed of sound and acoustic impedance of water, respectively.

A more detailed description thereof is as follows. Calculated using Equations 1 to 3 and referring to FIG. 4, in order to prevent the total reflection from occurring at the interface between the medium 200 forming the channel 300 and the fluid included in the channel 300, the critical angle $\theta_c$ at which the total reflection occurs needs to be greater than $\pi/2-\theta_R$, and thus the speed of sound ($C_{wall}$) of the medium 200 at room temperature needs to be greater than 1402 m/s.

In order to reduce the effect of total reflection and generate the uniform acoustic pressure field inside the channel 300, a material having a speed of sound greater than 1262 m/s at room temperature may be used as the medium 200. However, when the material of the medium 200 forming the channel 300 has a speed of sound greater than 1700 m/s at room temperature, the material loses its physical properties as an elastomer, thereby making it difficult to bond with the substrate 500, and thus, the speed of sound ($C_{wall}$) of the material is preferably smaller than 1700 m/s.

In other words, when the fluid is water, it is preferable to satisfy Equation 4 below at room temperature in order to match the speed of sound ($C_{wall}$) of the medium 200 and the speed of sound ($C_{water}$) of water.

$$1262 \text{ m/s} < C_{wall} < 1700 \text{ m/s} \quad \text{[Equation 4]}$$

More preferably, in order to match the speed of sound ($C_{wall}$) of the material and the speed of sound ($C_{water}$) of water, the speed of sound ($C_{wall}$) of the material at room temperature is preferably greater than 1402 m/s and smaller than 1700 m/s. In this case, since Equation 3 is satisfied, the effect of total reflection may be removed, so that a more uniform acoustic pressure field may be formed in the fluid inside the channel 300.

Referring to Table 1, since PU has a speed of sound of 1548 m/s, PU meets the above conditions as a material having the speed of sound matching that of water. PU may also be used as a material of the medium 200 for the ease of fabricating a structure.

Figure 6:
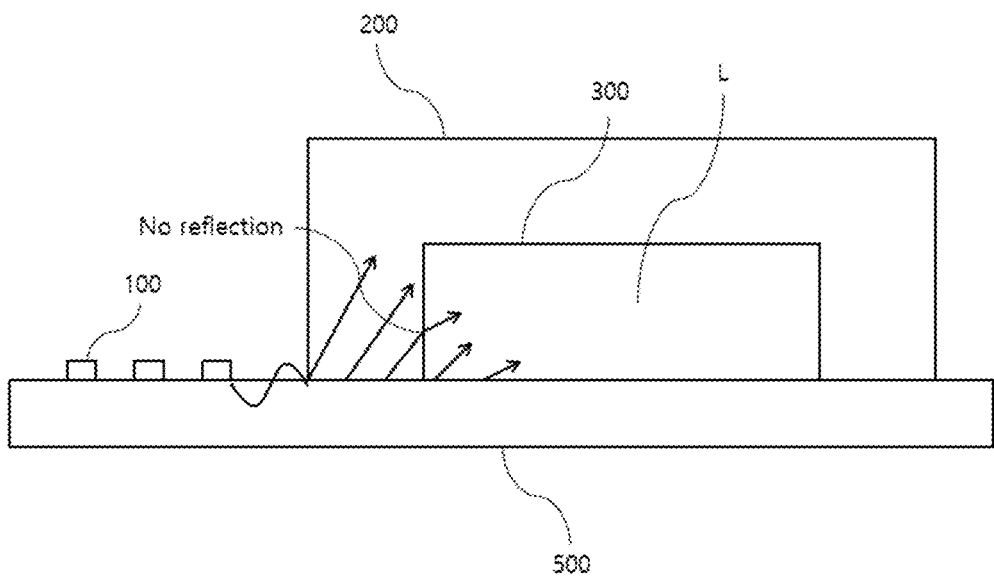
FIG. 6 is a partially enlarged cross-sectional view of the acoustic wave transmission device according to an embodiment of the present disclosure.

Referring to Table 1 and FIGS. 3 and 6, in the case in which PDMS is used as a material of the medium 200 for forming the channel, a local strong fluid flow occurs around the anechoic region when a traveling surface acoustic wave is applied to the surface acoustic wave device. The occurrence of such a local flow prevents uniform mixing of materials inside the channel 300, thereby reducing the usability as a mixing device.

On the other hand, when the channel 300 made of a material (PU) having a speed of sound matching the fluid (water) is used as in an embodiment of the present invention, the total reflection may be reduced at the interface between the medium 200 forming the channel 300 and the fluid inside the channel 300. That is, since the anechoic region is not generated inside the fluid 200 when the surface acoustic wave is transmitted to the fluid along the substrate 500 compared to using the conventional PDMS, it is possible to form a relatively uniform acoustic pressure field and flow field in the fluid, and may be greatly advantageous for manipulation and mixing of the fine particles throughout the channel 300.

As described above, when surface acoustic waves of the same frequency are generated and overlapped at the same time in opposite directions from both longitudinal ends of the surface acoustic wave device, the surface acoustic waves are overlapped to generate a standing wave on the surface of the substrate 500. Such a standing wave transfers energy to the fluid inside the channel, and may fix the fine particles in the fluid at a desired position while aligning the fine particles to the position corresponding to a node of the standing wave.

When the wave propagates from a medium 1 to a medium 2, a reflection coefficient $R_{12}$ is expressed as Equation 5 below.

$$R_{12} = \frac{Z_2 - Z_1}{Z_2 + Z_1} \quad \text{[Equation 5]}$$

Here, $Z_1$ and $Z_2$ mean acoustic impedances of the medium 1 and the medium 2, respectively. The larger the reflection coefficient $R_{12}$, the better the reflection to the medium 1 occurs.

Figure 1:
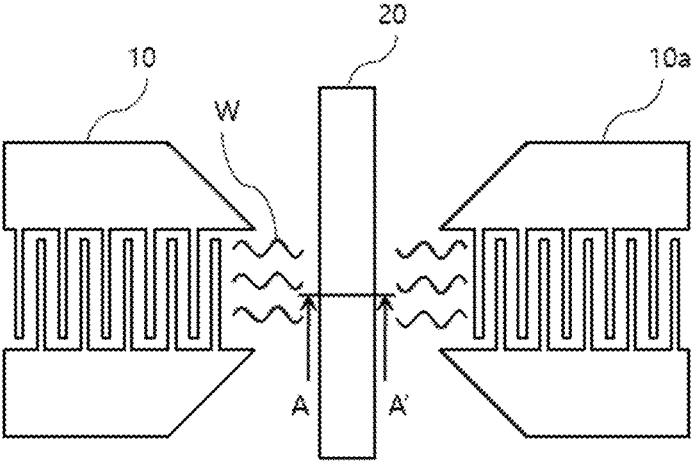
FIG. 1 is a schematic view of a conventional acoustic wave transmission device.
Figure 2:
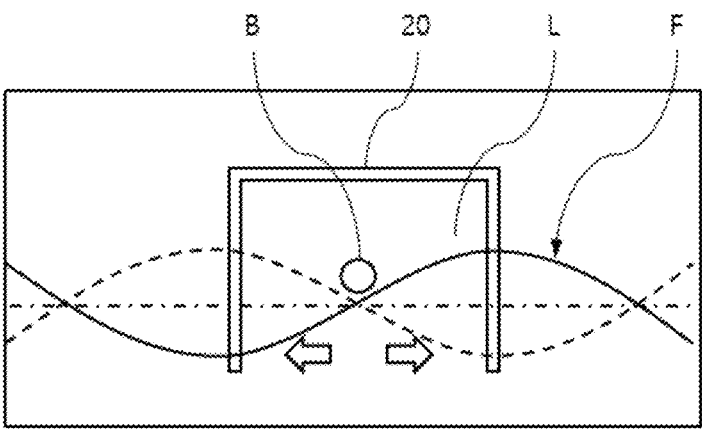
FIG. 2 is a cross-sectional view taken along line A-A' of FIG. 1.

On the other hand, when the fine particles are aligned using the standing wave as illustrated in FIG. 2, a wave reflected by an impedance difference between the media is generated at the interface between the channel inner wall on a ceiling side of the channel 300 and the fluid, and when the fine particles are affected by energy of the wave reflected in this way, there may be a problem in that the fine particles are aligned in unexpected positions.

In order to reduce the effect of reflection, the reflection coefficient $R_{12}$ needs to be small, and to this end, the acoustic impedance of the medium 200 constituting the channel 300 may preferably have a value matching the acoustic impedance of the fluid. Here, the matching of the acoustic impedances means that the acoustic impedance of the material has a similar value to the acoustic impedance of the fluid.

Preferably, the material may have the acoustic impedance in the range of 0.9 to 1.1 with respect to the acoustic impedance of the fluid. This is because, the difference in acoustic impedance between the material and the fluid is 10% or less within the ratio range, so that an energy amount of the reflected wave is 1% or less, and thus the effect of reflection may be ignored.

When the fluid is water, the acoustic impedance of PU has a ratio of about 1.08 to the acoustic impedance of water, and thus the above range is satisfied.

When the material of the medium 200 constituting the channel 300 is PDMS, $R_{12}$ is 0.18 when calculated by substituting the values of Table 1 into Equation 5 (medium 1 is water and medium 2 is PDMS).

In comparison, when calculating in the same way for the case in which the medium 200 made of PU is used as the channel 300 (medium 1 is water and medium 2 is PU), since $R_{12}$ has a much smaller reflection coefficient than that of PDMS as 0.04, it may be seen that the effect of reflection is greatly reduced. This is because the material (PU) of the medium 200 constituting the channel 300 has an acoustic impedance matching the fluid (water).

Meanwhile, when the wave propagates from the medium 1 to the medium 2, the movement path of the wave changes according to Snell's Law as expressed in Equation 6 below.

$$\frac{\sin\theta_1}{\sin\theta_2} = \frac{C_1}{C_2} \qquad \text{[Equation 6]}$$

Here, $\theta_1$ and $\theta_2$ refer to an incidence angle and a refraction angle, respectively, and $C_1$ and $C_2$ refer to the speed of sound in the medium 1 and the medium 2, respectively. That is, as the difference in the speed of sound between the two media increases, a path of the wave becomes more inclined at the interface between the media. Referring to the values in Table 1, PDMS has a large effect of refraction as the wave propagates into the water because the speed of sound thereof is about 0.7 times smaller than that of water, but in the case of PU used in the present invention, it has almost the same speed of sound, which is about 1.03 times that of water, so that the path change of the wave due to refraction hardly occurs.

In contrast, when a material (PU) having a speed of sound and an acoustic impedance matching those of the fluid (water) is used as the material of the medium 200 as in an embodiment of the present invention, since the influence of reflection and refraction at the interface between the channel inner wall of the channel 300 formed by the medium 200 and the fluid is greatly reduced, the pressure field is one-dimensionally formed, so that the manipulation and position prediction of the fine particles may be easy and when the standing surface acoustic wave is applied, the fine particles in the fluid may move without being attached to or fixed to the channel inner wall.

As a result, since the fine particles may be moved to a desired position without additional channel and device design, the surface acoustic wave device according to the present invention has a wider usability.

In the surface acoustic wave device according to an embodiment of the present invention, the channel 300 may have a hydrophilic surface.

Since PDMS has a hydrophobic surface and absorbs nano-particles (referring to particles having a diameter of less than 1 µm), there is a risk of sample loss. Therefore, when the channel 300 has a hydrophilic surface, such a risk may be prevented.

In the case in which PU is used as a material of the medium 200 forming the channel 300 as in the surface acoustic wave device according to an embodiment of the present invention, since PU not only prevents the risk of sample loss by having a hydrophilic surface but also may be applied to the manufacturing of various medical devices combined with the surface acoustic wave device in the future because it is a material used in actual artificial organs as a medical grade polymer.

On the other hand, in order to mold a width of the inner channel or chamber of the medium 200 to a micrometer unit or less using a material having the speed of sound and acoustic impedance similar to those of the fluid, such as polyurethane (PU), it is not easy to manufacture the width of the inner channel or chamber of the medium 200 by a medium manufacturing method using a general PDMS material. Therefore, the present invention has the following characteristic configuration in order to manufacture the medium 200 in which a channel of micrometer unit or less is formed using the polyurethane (PU) material.

More specifically, since it is impossible to directly mold a channel of a micrometer unit to a solid polyurethane (PU) material, the channel is formed by filling the mold on which the channel pattern is formed with a liquid polyurethane (PU) and solidifying the liquid PU. In this case, a metal mold that is easy to form the pattern of the micrometer unit is used as the mold, and when the channel is formed by filling the metal mold with the liquid PU, there is a problem in that precise channel molding is difficult due to deformation or cracks in the mold caused by heat and pressure during molding.

In order to solve such a problem, the present invention includes the following characteristic configuration to mold the medium 200 made of the PU material using a metal mold in which patterns for forming a channel in a micro unit are formed. Hereinafter, a manufacturing method of the medium 200 of the acoustic wave transmission device 1000 of the present invention will be described with reference to the drawings.

FIGS. 7 to 23 sequentially illustrate cross-sectional views of manufacturing method of the medium 200 according to an embodiment of the present invention.

Figure 7:
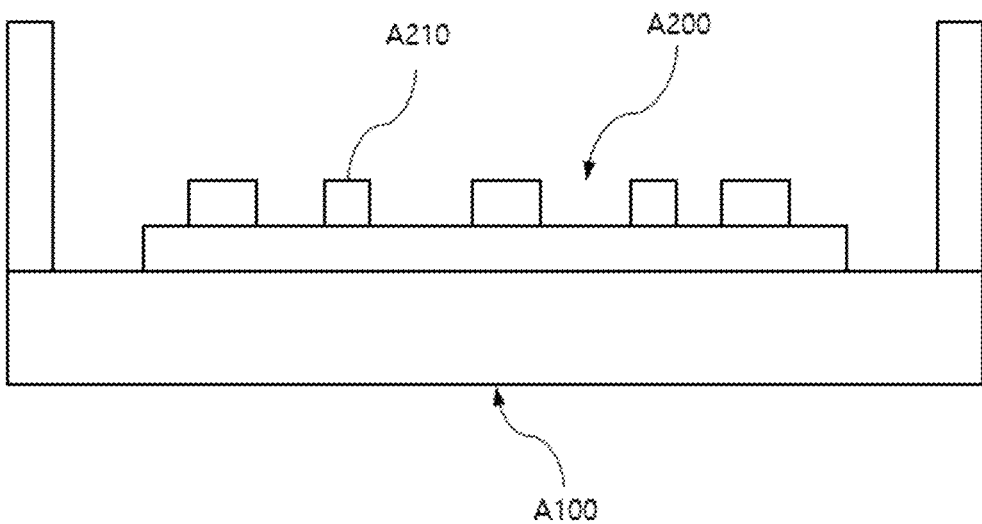
FIGS. 7 to 23 are schematic cross-sectional views illustrating a manufacturing method of an acoustic wave transmission device according to the present invention.

First, referring to FIG. 7, a first mold A200 made of a metal material having first patterns A210 formed thereon is disposed in a chamber A100 having an opened upper portion, for example, a chalet. The first mold A200 is for molding a second mold A400 (see FIG. 10) to be described later. A channel of the second mold A400 may be molded through the first pattern A210, and the first mold A200 may be made of a metal material, so that a width of the first pattern A210 may be processed in micrometer units.

Figure 8:
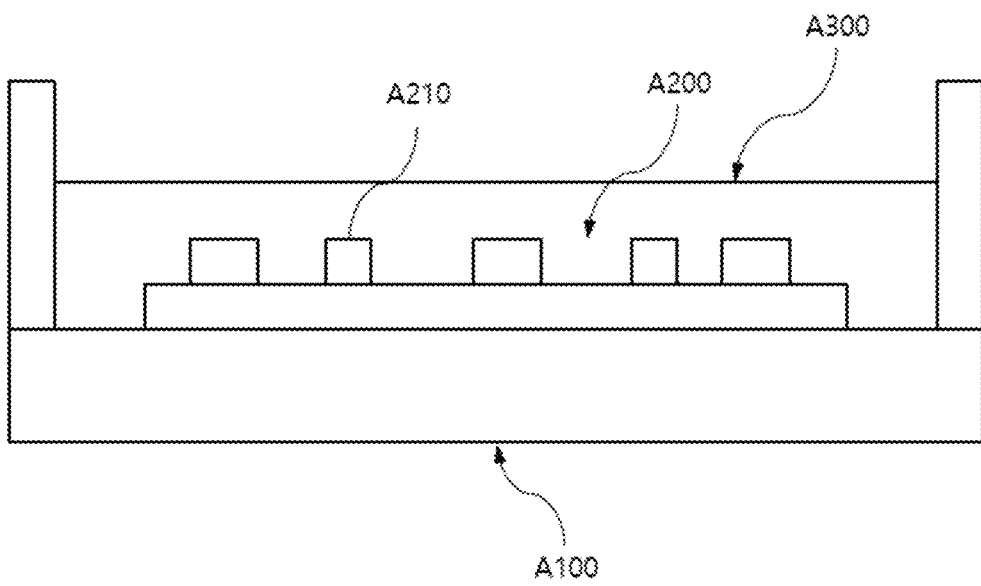

Next, as illustrated in FIG. 8, the chamber A100 in which the first mold A200 is disposed is filled with a liquid first resin A300. The first resin A300 may be made of a general PDMS material.

Figure 9:
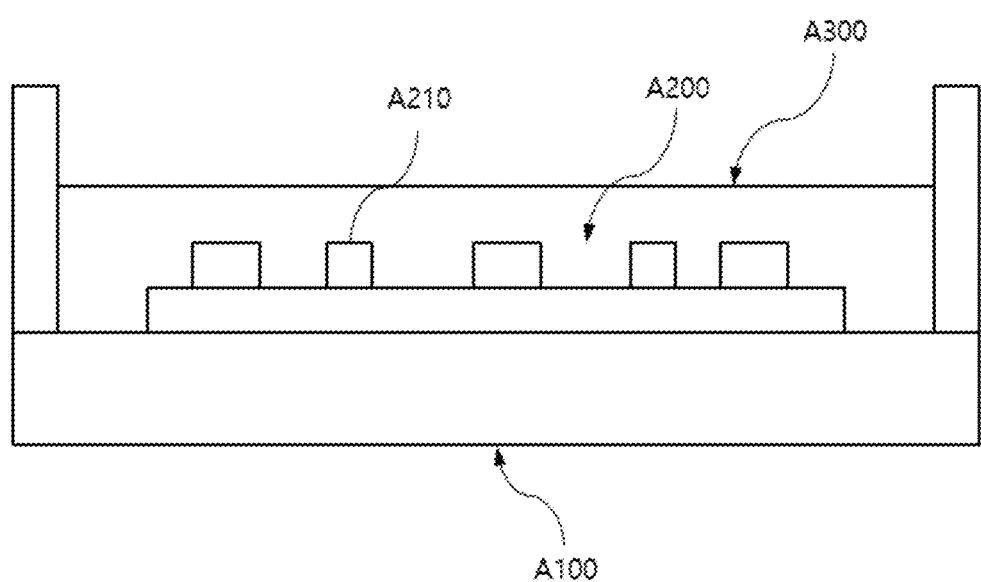

Next, as illustrated in FIG. 9, a second mold A400 made of a solid resin material is manufactured by heating the liquid first resin A300. A first channel 410 may be formed on the second mold A400 due to the first pattern A210 of the first mold A200.

Figure 10:
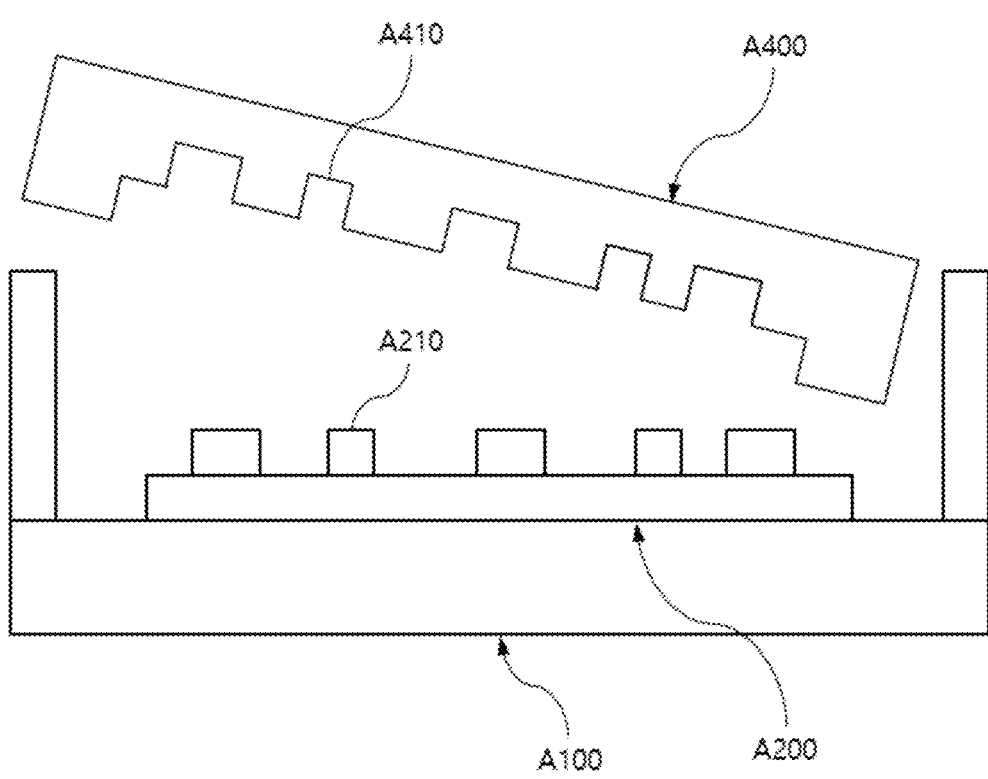
Figure 11:
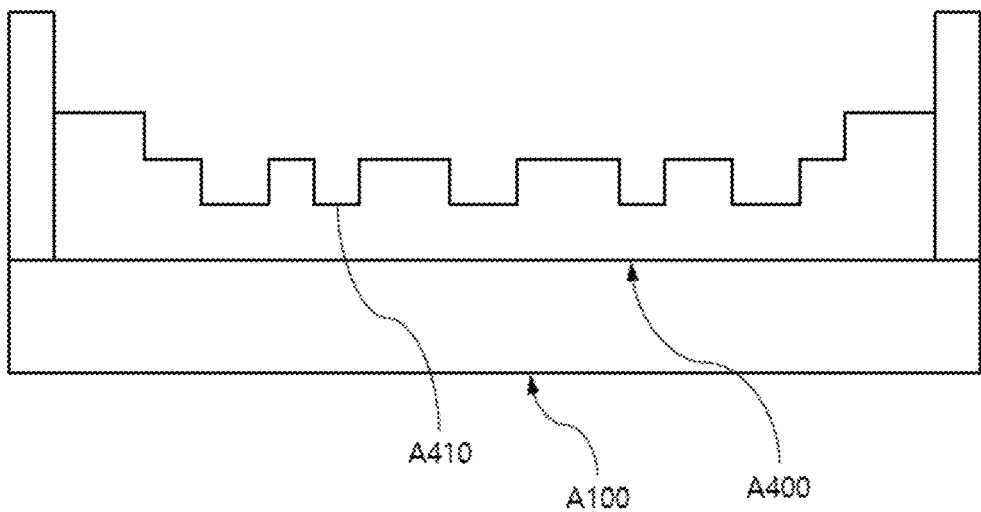

Next, as illustrated in FIGS. 10 and 11, after separating the second mold A400 from the first mold A200, the second mold A400 made of the resin material in which the first channel A410 is formed is disposed in the chamber A100 so that the first channel A410 faces upward.

Figure 12:
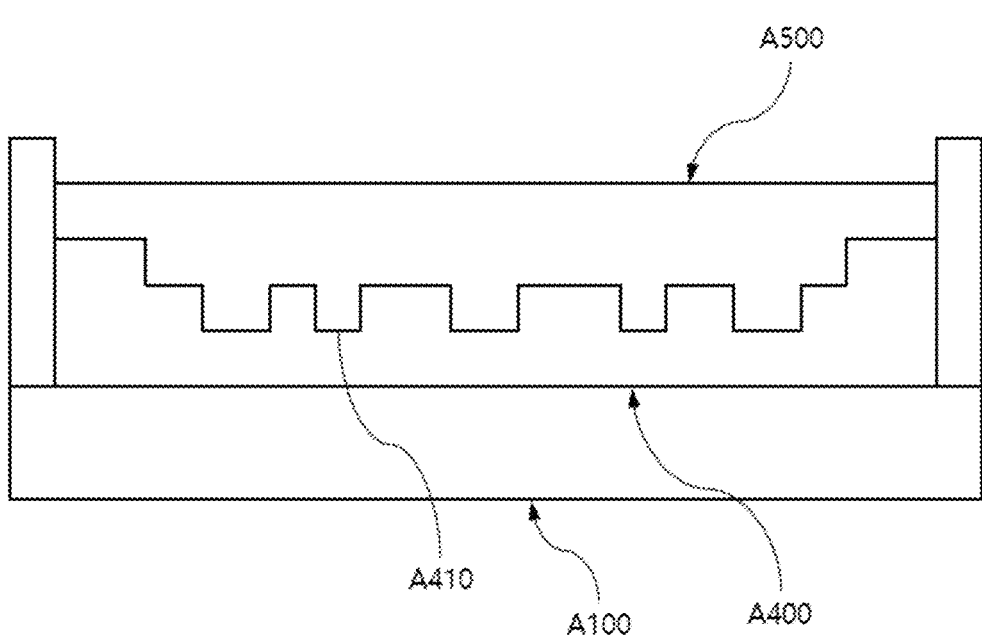

Next, as illustrated in FIG. 12, the chamber A100 in which the second mold A400 is disposed is filled with a liquid second resin A500. The second resin A500 may be made of a general PDMS material.

Figure 13:
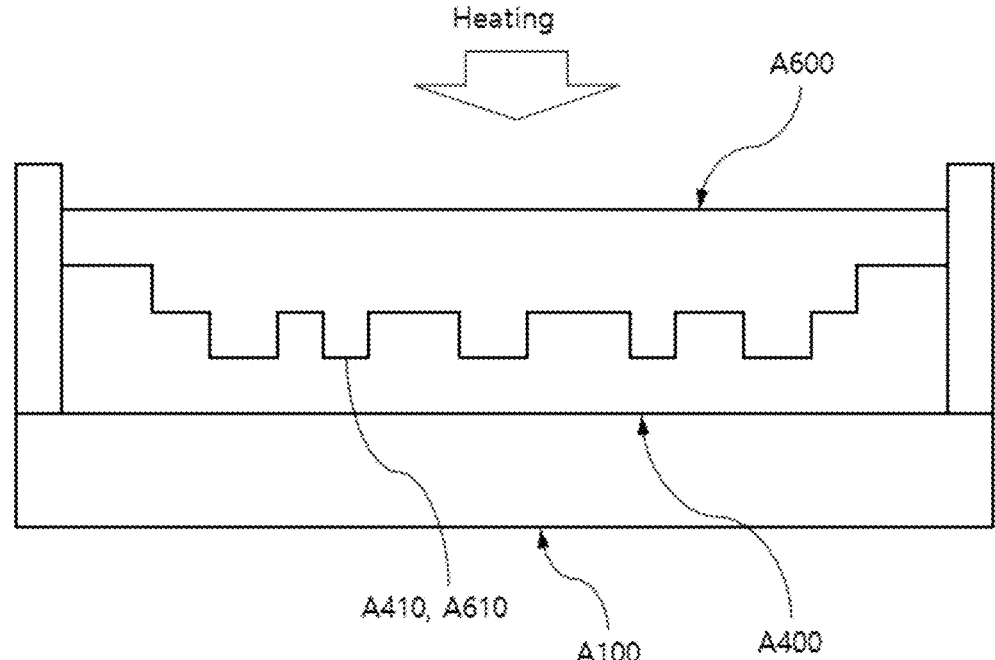

Next, as illustrated in FIG. 13, a third mold A600 made of a solid resin material is manufactured by heating the liquid second resin A500. A second pattern A610 may be formed on the third mold A600 due to the first channel A410 of the second mold A400.

Figure 14:
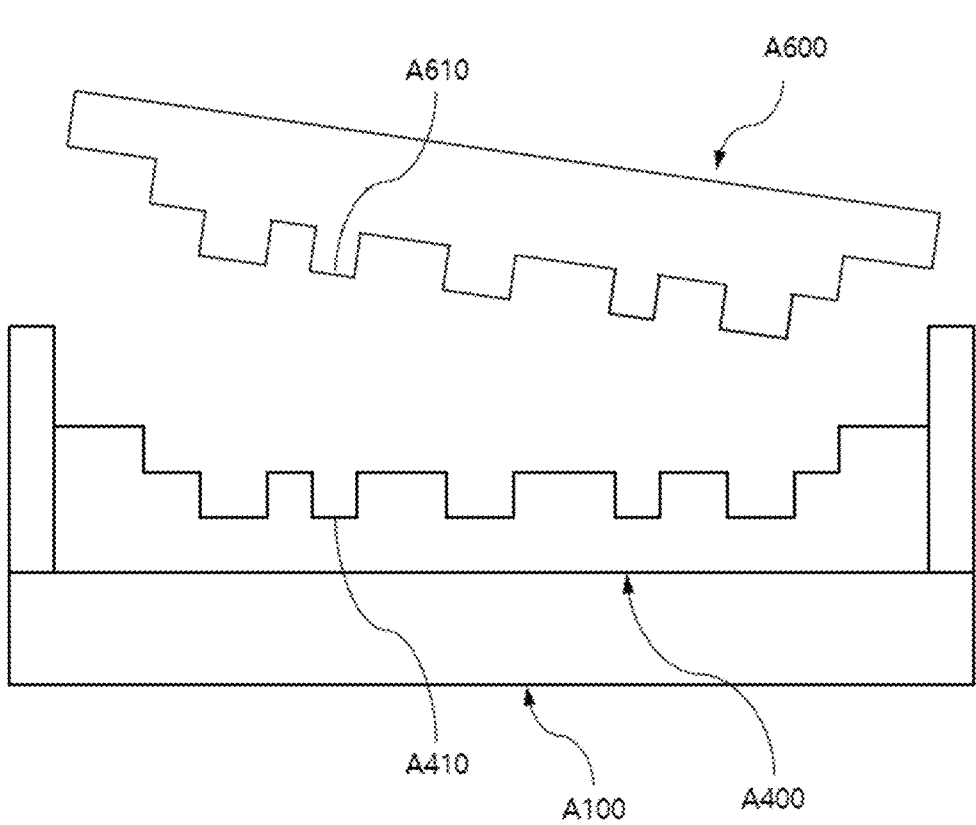
Figure 15:
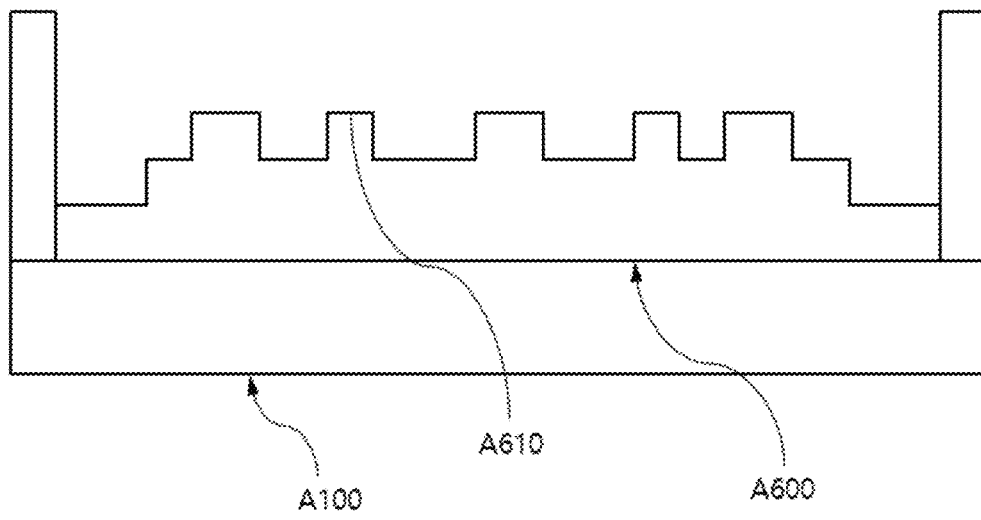

Next, as illustrated in FIGS. 14 and 15, after separating the third mold A500 from the second mold A400, the third mold A600 made of the resin material in which the second pattern A610 for micro-channel molding of a final medium is formed is disposed in the chamber A100 so that the second pattern A610 faces upward.

Figure 16:
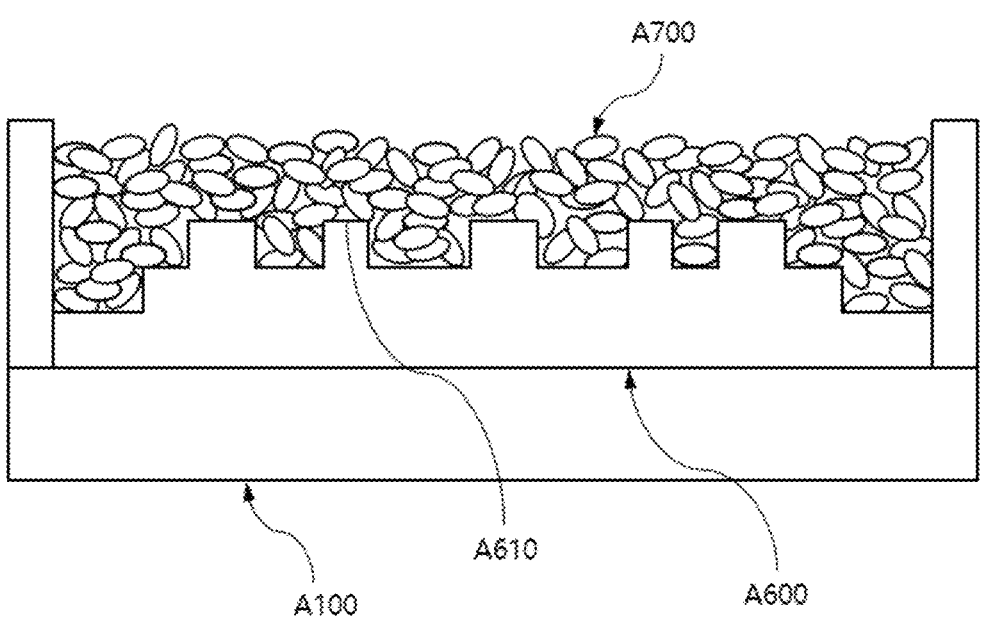

Next, as illustrated in FIG. 16, the chamber A100 in which the third mold A600 is disposed is filled with medium raw materials A700 in the form of a pallet.

Figure 17:
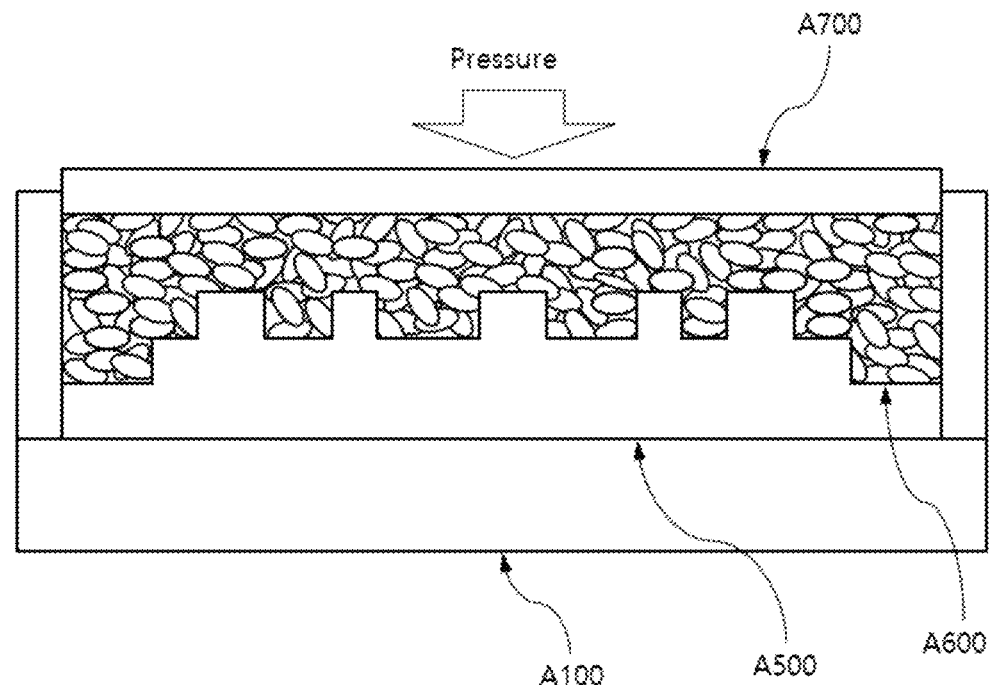
Figure 18:
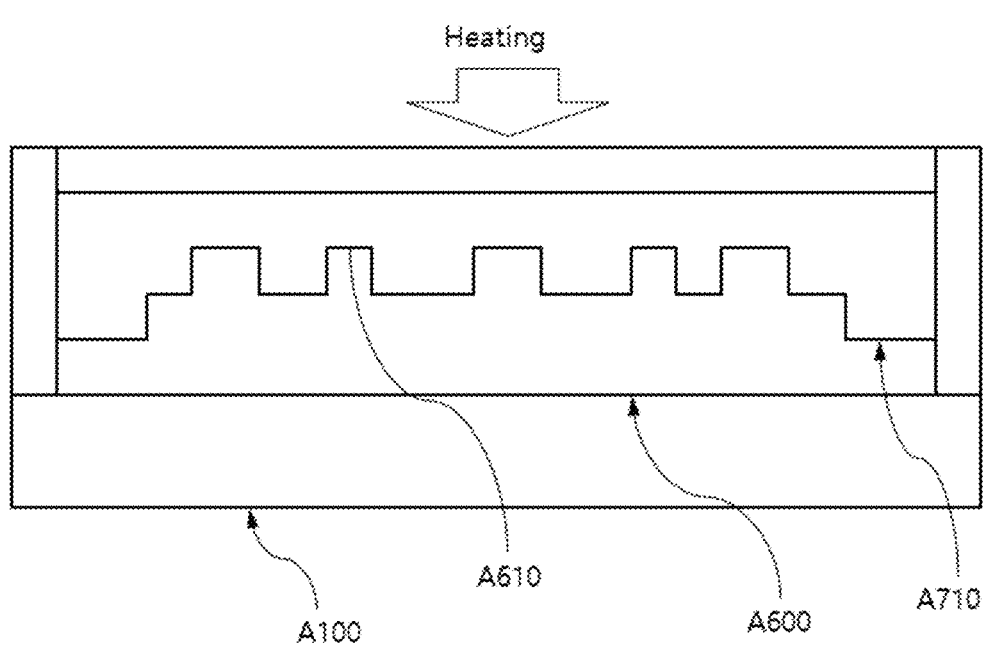

Next, as illustrated in FIGS. 17 and 18, the medium raw materials A700 are arranged to be in close contact with each other by pressing the medium raw materials A700 in the form of pellets toward the third mold A600, and then heated to manufacture a liquid medium raw material A710.

Figure 19:
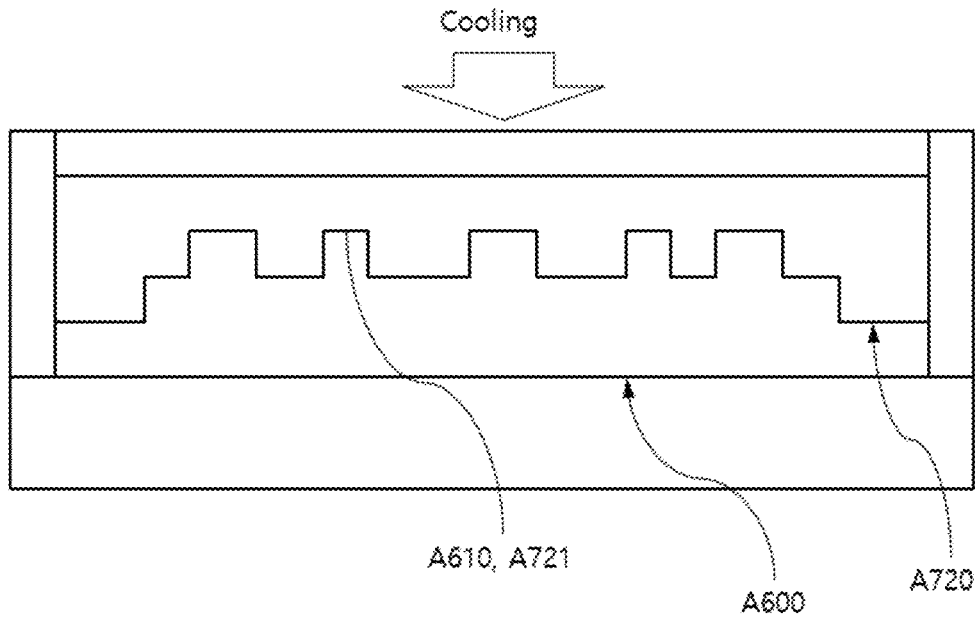

Next, as illustrated in FIG. 19, the liquid medium raw material A710 is solidified. More specifically, a medium resin A720 is completed by cooling the liquid medium raw material A710. A third channel A721 may be formed on the medium resin A720 due to the second pattern A610 of the third mold A600.

Figure 20:
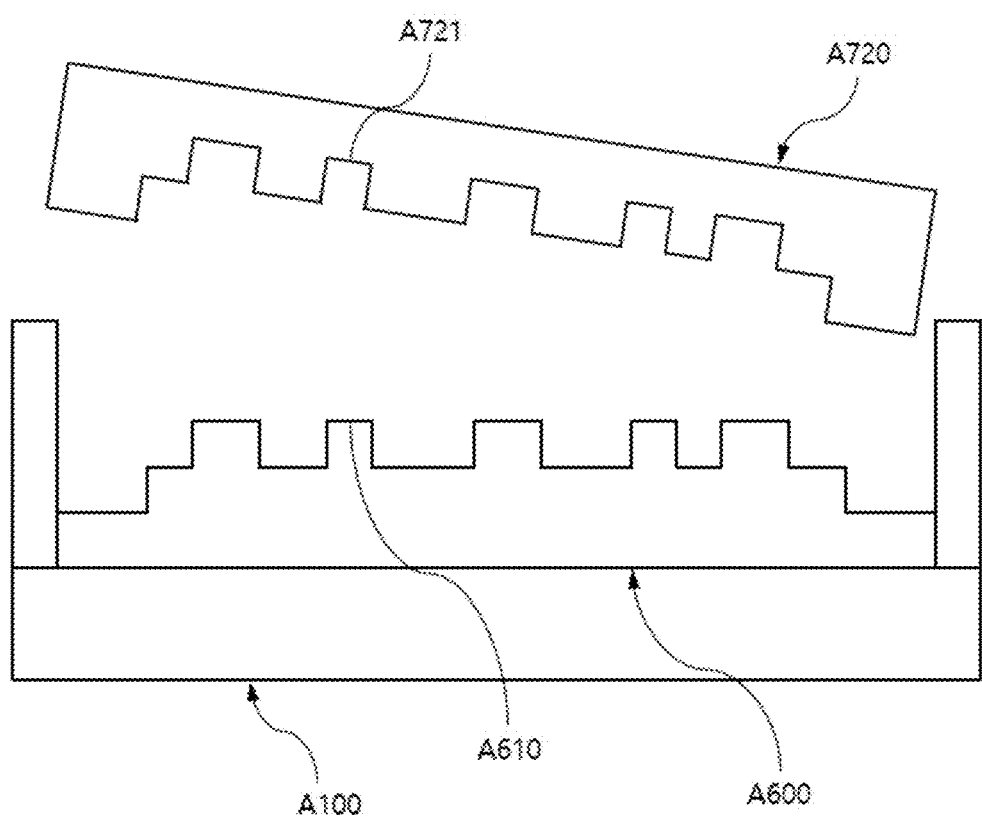
Figure 21:
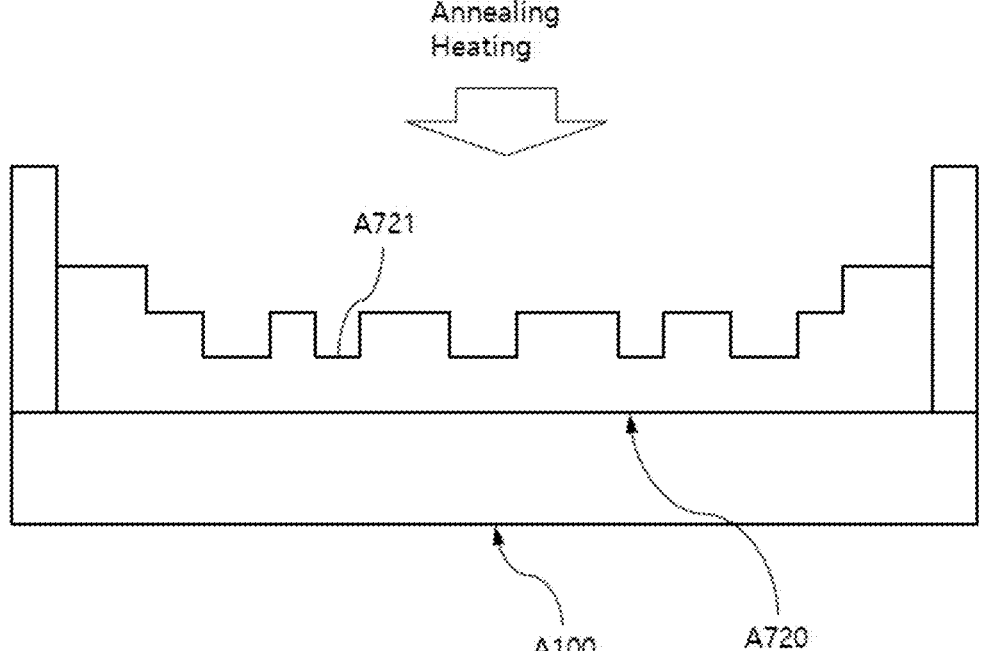

Next, as illustrated in FIGS. 20 and 21, after separating the medium resin A720 from the third mold A600, the medium resin A720 made of a polyurethane (PU) material in which the third channel A721 is formed is disposed in the chamber A100 so that the third channel A721 faces upward, and is heat-treated by final heating.

Figure 22:
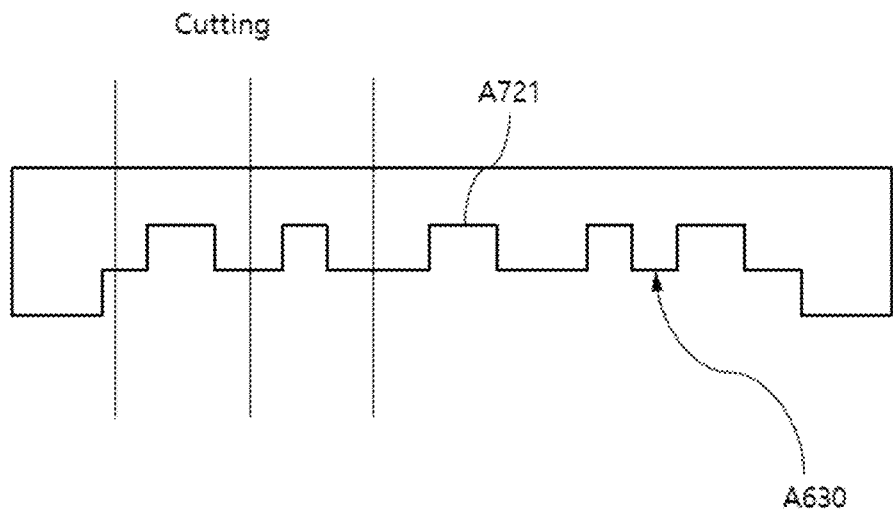
Figure 23:
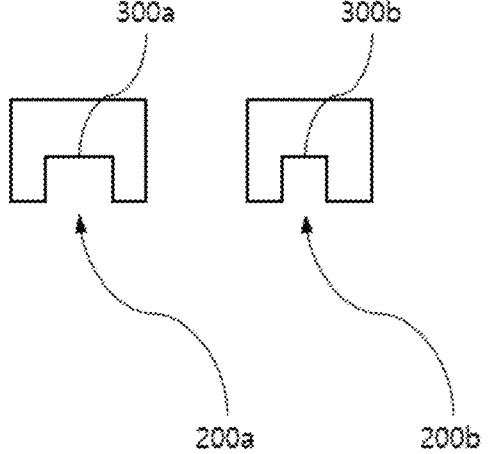

Next, as illustrated in FIGS. 22 and 23, the media 200*a* and 200*b* made of a polyurethane (PU) material in which channels 300*a* and 300*b* having a width of micrometer units are formed are completed by cutting the medium resin A720 in which a plurality of third channels A721 are formed according to a shape of the medium.

The technical idea should not be interpreted limited to the above-described embodiment of the present invention. The present invention may be applied to various fields and may be variously modified by those skilled in the art without departing from the scope of the present invention claimed in the claims. Accordingly, such improvements and modifications fall within the protection scope of the present invention as long as it is apparent to those skilled in the art.

DETAILED DESCRIPTION OF MAIN ELEMENTS

1000: acoustic wave transmission device
100, 100*a*: acoustic wave generator
200: acoustic wave transmission medium
300: channel
500: substrate
L: fluid
A100: chamber
A200: first mold
A210: first pattern
A300: first resin
A400: second mold
A410: first channel
A500: second resin
A600: third mold
A610: second pattern
A700: medium raw material
A710: liquid medium raw material
A720: medium resin
A721: second channel

The invention claimed is:

1. An acoustic wave transmission device comprising:
an acoustic wave transmission medium in which a fluid containing fine particles is accommodated and a channel is formed, wherein the channel is configured to transport the fluid or the fine particles in the fluid; and
an acoustic wave generator disposed adjacent to the acoustic wave transmission medium to transmit an acoustic wave to the acoustic wave transmission medium to transport the fluid or the fine particles in the fluid to a desired position,
wherein the acoustic wave transmission medium is made of polyurethane (PU) or hydrogel having a speed of sound and an acoustic impedance each within ±5% of those of the fluid, so that an anechoic region is not formed within the fluid.

2. The acoustic wave transmission device of claim 1, wherein
the fine particles have a size of 1 nanometer or more and 100 micrometers or less.

3. The acoustic wave transmission device of claim 1, wherein
the acoustic wave generator
includes a substrate and a signal generator provided on the substrate to transmit surface acoustic waves to the acoustic wave transmission medium.

4. The acoustic wave transmission device of claim 3, wherein
the substrate is made of a piezoelectric element, and
the acoustic wave transmission medium is coupled to the piezoelectric element.

5. The acoustic wave transmission device of claim 3, wherein
the substrate is made in a form in which a piezoelectric element is coupled onto a flexible film, and
the acoustic wave transmission medium is coupled to the piezoelectric element.

6. The acoustic wave transmission device of claim 1, wherein
the acoustic wave generator includes a silicon wafer to which the acoustic wave transmission medium is fixed, and
transmits bulk acoustic waves to the acoustic wave transmission medium through a resonance frequency of the silicon wafer.

7. The acoustic wave transmission device of claim 1, wherein
the acoustic wave generator includes an acoustic transducer, and
contacts the acoustic transducer with the acoustic wave transmission medium to transmit bulk acoustic waves to the acoustic wave transmission medium.

* * * * *